US012567285B2

(12) United States Patent (10) Patent No.: US 12,567,285 B2
Ziehmer et al. (45) Date of Patent: Mar. 3, 2026

---

(54) METHOD FOR THE AUTOMATIC MONITORING OF AN ELECTROTECHNICAL WORK FLOW, AND CORRESPONDING DEVICE

(71) Applicant: DEHN SE, Neumarkt i.d.OPf. (DE)

(72) Inventors: Rainer Ziehmer, Fuldatal (DE);
Christian Paulus, Lupburg (DE);
Wolfgang Meier, Neumarkt (DE)

(73) Assignee: DEHN SE, Neumarkt i.d.OPf. (DE)

( * ) Notice: Subject to any disclaimer, the term of this patent is extended or adjusted under 35 U.S.C. 154(b) by 429 days.

(21) Appl. No.: 18/018,329

(22) PCT Filed: Aug. 13, 2021

(86) PCT No.: PCT/EP2021/072642
§ 371 (c)(1),
(2) Date: Jan. 27, 2023

(87) PCT Pub. No.: WO2022/034230
PCT Pub. Date: Feb. 17, 2022

(65) Prior Publication Data
US 2023/0298390 A1 Sep. 21, 2023

(30) Foreign Application Priority Data
Aug. 14, 2020 (DE) .......................... 102020210371.2

(51) Int. Cl.
*G07C 3/14* (2006.01)
*G01R 19/155* (2006.01)
(Continued)

(52) U.S. Cl.
CPC ............ *G07C 3/14* (2013.01); *G01R 19/155* (2013.01); *G01W 1/10* (2013.01); *G07C 3/10* (2013.01);
(Continued)

(58) Field of Classification Search
CPC .......... G07C 3/14; G07C 3/10; G01R 19/155; G01R 35/00; G01R 19/16561; G01R 31/66; G01W 1/10
See application file for complete search history.

(56) References Cited

U.S. PATENT DOCUMENTS

2022/0120800 A1 4/2022 Cazor et al.
2022/0155772 A1* 5/2022 Charbonnel ....... G05B 23/0283

FOREIGN PATENT DOCUMENTS

CN 108656954 A 10/2018 ................ B60L 3/00
DE 9400903 U1 3/1994 ............ G01R 29/08
(Continued)

OTHER PUBLICATIONS

Schönig et al. (IoT meets BPM: a bidirectional communication architecture for IoT-aware process execution. Softw Syst Model 19, 1443â1459. Mar. 19, 2020. https://doi.org/10.1007/s10270-020-00785-7) (Year: 2019).*

(Continued)

*Primary Examiner* — Catherine T. Rastovski
*Assistant Examiner* — Christian T Bryant
(74) *Attorney, Agent, or Firm* — Bodner & Bodner, PLLC; Gerald T. Bodner; Christian P. Bodner

(57) ABSTRACT
The present invention relates to a method for the automatic monitoring of an electrotechnical work flow and to a corresponding device. The method comprises the following steps: establishing (S0) a first bidirectional communications link (F1) between a mobile communications unit (1) and a mobile voltmeter (10); starting (S1) a work step sequence program on a mobile communications unit (1) by means of an input device (1b) of the mobile communications unit (1); outputting (S2) a work step instruction of a plurality of work step instructions (A) to disconnect a live electronic compo- (Continued)

nent (K1) in order to effect an absence of voltage at the electronic component (K1) on an outputting device (1a) of the mobile communications unit (1) by the work step sequence program; automatically or manually confirming (S3) the disconnection of the electronic component (K1) at the mobile communications unit (1); following the confirmation (S3) of the disconnection of the electronic component (K1), outputting (S4) a work step instruction of the plurality of work step instructions (A) to check the absence of voltage at the electronic component (K1) by means of the mobile voltmeter (10) on the outputting device (1a) of the mobile communications unit (1) by the work step sequence program; checking (S5) the absence of voltage at the electronic component (K1) by means of the mobile voltmeter (10); communicating (S6) the result of the check from the mobile voltmeter (10) to the mobile communications unit (1); if the result of the check indicates an absence of voltage, automatically confirming (S8) the check of the absence of voltage from the electronic component (K1) by outputting a confirmation signal by the mobile communications unit (1); if the result of the check does not indicate an absence of voltage, outputting (S9a) a first alarm signal by the mobile communications device (1).

33 Claims, 14 Drawing Sheets

(51) Int. Cl.

| | | |
|---|---|---|
| *G01R 19/165* | (2006.01) | |
| *G01R 31/66* | (2020.01) | |
| *G01R 35/00* | (2006.01) | |
| *G01W 1/10* | (2006.01) | |
| *G07C 3/10* | (2006.01) | |

(52) U.S. Cl.
CPC ........ *G01R 19/16561* (2013.01); *G01R 31/66* (2020.01); *G01R 35/00* (2013.01)

(56) References Cited

FOREIGN PATENT DOCUMENTS

| | | | | |
|---|---|---|---|---|
| DE | 102011104819 A1 | 12/2012 | ............. | B60L 11/18 |
| DE | 102014218096 A1 | 3/2016 | ............. | G07C 3/14 |
| DE | 102014218481 A1 | 3/2016 | ............. | G01R 15/14 |
| DE | 102016104692 A1 | 9/2017 | ............. | G07C 3/14 |
| FR | 3092230 A1 | 8/2020 | ........... | A41D 13/008 |
| JP | 2017034751 A * | 2/2017 | | |
| WO | WO2015051039 A1 | 4/2015 | ............. | G01R 29/08 |
| WO | WO2020161241 A1 | 8/2020 | ............. | H02B 1/52 |

OTHER PUBLICATIONS

Schönig et al. ("IoT-basiertes Prozessmanagement", Informatik Spektrum, Springer Verlag, Berlin, DE, vol. 42, No. 2, Jan. 30, 2019, pp. 130-137, XP036781427) (Year: 2019).*

Schönig, et al., "IoT-basiertes Prozessmanagement", Informatik Spektrum, Springer Verlag, Berlin, DE, vol. 42, No. 2, Jan. 30, 2019, pp. 130-137, XP036781427, the whole document. Abstract and full text available at: https://link.springer.com/article/10.1007/s00287-019-01140-x (last accessed on Mar. 23, 2023).

Fraunhofer Institute for Integrated Circuits IIS, "*Tool Tracking*", full text available at: https://www.iis.fraunhofer.de.en/ff/lv/dataanalytics/anwproj/werkzeug.html (last accessed on Mar. 23, 2023).

The Notification Concerning Transmittal of International Preliminary Report on Patentability (Chapter I of the Patent Cooperation Treaty), in English, dated Feb. 23, 2023, which was issued by the International Bureau of WIPO in Applicant's corresponding international PCT application having Serial No. PCT/EP2021/072642, filed on Aug. 13, 2021.

The English translation of the International Preliminary Report on Patentability (Chapter I of the Patent Cooperation Treaty), dated Feb. 7, 2023, which was issued by the International Bureau of WIPO in Applicant's corresponding international PCT application having Serial No. PCT/EP2021/072642, filed on Aug. 13, 2021.

The Written Opinion of the International Searching Authority, in English, dated Dec. 22, 2021, which was issued by the International Bureau of WIPO in Applicant's corresponding international PCT application having Serial No. PCT/EP2021/072642, filed on Aug. 13, 2021.

The International Search Report, in English, dated Dec. 22, 2021, which was issued by the International Bureau of WIPO in Applicant's corresponding international PCT application having Serial No. PCT/EP2021/072642, filed on Aug. 13, 2021.

An Office Action (in German), dated May 12, 2021, issued by the German Patent Office for Applicant's corresponding German Patent Application No. DE102020210371.2, filed Aug. 14, 2020.

* cited by examiner

Fig. 12

METHOD FOR THE AUTOMATIC MONITORING OF AN ELECTROTECHNICAL WORK FLOW, AND CORRESPONDING DEVICE

The present invention relates to a method for the automatic monitoring of an electrotechnical workflow and a corresponding device.

PRIOR ART

DE 10 2016 104 692 A1 discloses a system for logging the execution of a workflow, particularly a servicing and/or test process, using sensor devices for the generation of representative signals for predefined work steps in the workflow and evaluation devices for the comparison of signals generated with saved target signals, and the automatic output of logging information on the basis of this comparison.

DE 10 2014 218 096 A1 discloses a method and a device for monitoring a production and/or assembly process, wherein the production and/or assembly process comprises at least three steps and each step is monitored by at least one sensor, and a result of monitoring is concluded herefrom.

Although applicable to any arbitrary electrotechnical workflow in which a portable voltage testing device is employed, the present invention and the fundamental issue giving rise thereto are described with reference to five safety rules associated with an electrotechnical workflow for the servicing of a high-voltage installation.

For the servicing of an electrotechnical installation, there are five safety rules, the sequence of which must be strictly observed by the servicing engineer. These five safety rules comprise the following work steps:

1. Isolation,
2. Protection against reclosing,
3. Confirmation of isolation from supply,
4. Grounding and short-circuiting,
5. Fitting of covers or guards to adjoining live parts.

In installations of rating up to 1 kV, isolation is generally executed by the opening of circuit-breakers, fault current protection devices, fuse-disconnectors and power breakers, or by the removal of fuse-links or isolating links using a pole-mounted low-voltage high-breaking-capacity fuse puller according to DIN EN 61243-3, while wearing a face visor and safety helmet.

In installations of rating exceeding 1 kV, isolation is executed by the opening of circuit-breakers and associated disconnectors in switchgear installations, or by the opening of switch-disconnectors in substations.

All switching devices by means of which the workstation has been isolated must then be secured against reclosing.

Isolation by the removal of fuse-links or screw-in circuit-breakers is executed, as indicated above, in low-voltage installations. These links and/or breakers must not only be released, but must be entirely removed.

In order to prevent any unauthorized reclosing, the safeguarding of any parts removed is stipulated. Advantageously, any elements removed are replaced by dummy links or screw caps, which can only be removed using a special tool. In this case, this tool must be safeguarded. Permanently-fitted circuit-breakers, in the open state, must be secured against reclosing, e.g. by means of locking pins, plug-on caps or adhesive foils.

In manually-operated mechanisms, lockable lock-out devices are appropriate, e.g. padlocks. In switchgear, the actuating mechanism must be locked-out and auxiliary power supplies disabled. In spring-loaded manually-operated mechanisms, a bolt or locking bar must be inserted at an appropriate point, which will prevent the actuation of the switch. In pneumatic operating mechanisms, the supply line must be interrupted and—on the grounds of any potential loss of leak-tightness in valves—the drive mechanism vented (e.g. by removing the cap of the emergency compressed air supply nozzle). In electrically-operated mechanisms, the actuating power circuit must be disconnected.

In the case of stored-program control functions and computer-aided switching operations, software must be configured such that any unintentional reclosing is securely prevented.

Isolation from supply must be confirmed directly at the workstation. This measure will also apply in the event that:

switches have been interchanged during isolation;
further potential infeeds have been overlooked, e.g. feedback voltage, standby power supply, or similar;
the engineer has changed their workstation;
accidental energization occurs, e.g. as a result of an interruption in a PEN conductor.

Isolation from supply of isolated plant components is confirmed by means of an appropriate, generally portable voltage testing device.

Grounding and short-circuiting at the workstation ensures the secure maintenance of isolation from supply for the duration of works, including isolation with respect to interference voltages, atmospheric overvoltages or spurious reclosing.

Grounding and short-circuiting are executed by means of permanently installed grounding switches according to DIN EN IEC 62271-102, by means of positive-action grounding rod and short-circuiting devices according to DIN EN 61219 (DIN VDE 0683-200) or by means of independent and portable grounding and short-circuiting devices according to DIN EN 61230 (DIN VDE 0683-100).

Plant components in the vicinity of the workstation (within the approach zone) which cannot be isolated must be fitted with covers or guards prior to the commencement of works, e.g. in the form of a protective device, a cover, an encapsulation or insulating cladding, etc.

Notwithstanding the strict stipulation of the five safety rules, isolated accidents can still occur as a result of human error.

Accordingly, the object of the present invention is the provision of a method for the automatic monitoring of an electrotechnical workflow and of a corresponding device, which provide improved safety for a user.

DISCLOSURE OF THE INVENTION

The present invention provides a method for the automatic monitoring of an electrotechnical workflow according to claim 1, and a corresponding device according to claim 23.

Preferred further developments are the subject matter of the respective subclaims.

ADVANTAGES OF THE INVENTION

According to the fundamental concept of the present invention, communication of the test result from the portable voltage testing device to the portable communication device is executed and, in the event that the test result indicates isolation from supply, automatic confirmation of the checking of the isolation of electronic components from supply is executed by the generation of a confirmation signal by the portable communication device, or in the event that the test result does not indicate isolation from supply, a first alarm signal is generated by the portable communication device.

The method according to the invention thus permits an enhancement of work safety, as the user is not only alerted to the display on the portable voltage testing device, but can additionally be warned by the portable communication device, e.g. by the generation of an acoustic and/or optical signal or a vibration alarm.

According to a preferred embodiment, a second bidirectional communication link is set up between the portable communication device and a stationary central communication device, wherein the test result is communicated by the portable voltage testing device, either directly or via the portable communication device, to the stationary central communication device. Test results can thus be recorded centrally, saved, and retrieved at a later date for control purposes.

According to a further preferred embodiment, at least one savable test parameter of the portable voltage testing device is retrievable and/or adjustable by the portable communication device. The voltage testing device can thus be programed and monitored in a user-specific manner.

According to a further preferred embodiment, the test parameter comprises an acoustic or electronic indicator setting and/or an additional function and/or a rated data parameter, particularly a voltage measurement range and/or a battery capacity and/or a mandatory test time for retesting and/or an operational availability of the portable voltage testing device.

According to a further preferred embodiment, the portable communication device comprises a time logging device, wherein checking of the isolation from supply of the electronic component using the portable voltage testing device is logged on a time basis by the work step sequence program and saved in the portable communication device. Work steps can thus be recorded and saved with a time stamp.

According to a further preferred embodiment, the portable communication device comprises a GPS location device, wherein checking of the isolation from supply of the electronic component using the portable voltage testing device is logged geographically by the work step sequence program and saved in the portable communication device. Work steps can thus be recorded and saved with an associated work location.

According to a further preferred embodiment, the portable communication device comprises a weather forecasting device wherein, in the event of a predefined weather forecast, particularly an adverse weather forecast, a warning indication is generated in the work step sequence program. A user can thus be alerted to a weather-related hazard situation.

According to a further preferred embodiment, confirmation of the isolation of the electronic component is executed automatically by an isolation confirmation device which is communicatively connected to the portable communication device wherein, in the event of failed confirmation, output of a second alarm signal is generated by the portable communication device, and wherein the isolation confirmation device comprises an imaging device and/or a circuit state indicator device of a voltage switch which is to be actuated for isolation and/or an electroluminescence measurement device for measuring an electric field on the electronic component. This further enhances work safety.

According to a further preferred embodiment, further to the confirmation of the isolation of the electronic component and prior to the generation of the work step instruction for the checking the isolation from supply of the electronic component, output of a work step instruction for safeguarding the electronic component against reclosing is generated by the work step sequence program, followed by an automatic or manual confirmation of the safeguarding of the electronic component against reclosing on the portable communication device.

According to a further preferred embodiment, confirmation of the safeguarding of the electronic component against reclosing is executed automatically by a reclosing protection confirmation device which is communicatively connected to the portable communication device wherein, in the event of failed confirmation, output of a third alarm signal is generated by the portable communication device, and wherein the reclosing protection confirmation device comprises an imaging device and/or a lock-out status notification device of a lock which is to be actuated for protection against reclosing. This further enhances work safety. A locking function can also be software-based, wherein it should be ensured that, during works, no other user can disable the lock-out function using another device.

According to a further preferred embodiment, in the event that the test result indicates isolation from supply and the confirmation signal is generated by the portable communication device, output of a work step instruction for the grounding and short-circuiting of the electronic component is generated by the work step sequence program, followed by automatic or manual confirmation of the grounding and short-circuiting of the electronic component on the portable communication device. This enhances work safety still further.

According to a further preferred embodiment, confirmation of the grounding and short-circuiting of the electronic component is executed automatically by a grounding/short-circuiting confirmation device which is communicatively connected to the portable communication device and, in the event of failed confirmation, output of a fourth alarm signal is generated by the portable communication device, wherein the grounding/short-circuiting confirmation device comprises an imaging device and/or a clamp detection device for detecting the clamp function of a clamping device which is employed for grounding and short-circuiting (e.g. a pressure sensor, torque sensor, force sensor or similar) and/or a device for detecting fixed ball points on a ball-head cap of the clamping device. This enhances work safety still further.

According to a further preferred embodiment, further to the confirmation of the grounding and short-circuiting of the electronic component, output of a work step instruction for safeguarding and barrier protection of adjoining energized electronic components is generated by the work step sequence program, followed by an automatic or manual confirmation of safeguarding and barrier protection of adjoining energized electronic components on the portable communication device. This enhances work safety still further.

According to a further preferred embodiment, confirmation of the safeguarding and barrier protection of adjoining energized electronic components is executed automatically by a safeguarding/barrier protection confirmation device which is communicatively connected to the portable communication device and, in the event of failed confirmation, output of a fifth alarm signal is generated by the portable communication device, wherein the safeguarding/barrier protection confirmation device comprises an imaging device and/or a position detection device of the position of a barrier device which is employed for safeguarding and barrier protection. This enhances work safety still further.

According to a further preferred embodiment, an item of protective equipment is provided for a user, wherein a third bidirectional communication link is set up between the portable communication device and the item of protective equipment, and wherein the portable communication device transmits at least one of the first to fifth alarm signals via the third bidirectional communication link to the item of protective equipment for the triggering of an optical and/or acoustic warning device and/or a vibration alarm device which is fitted to the item of protective equipment. Warning effectiveness is enhanced accordingly.

According to a further preferred embodiment, the item of protective equipment comprises a safety jacket and/or safety helmet and/or safety goggles and/or a safety coat and/or protective overalls and/or a protective coat.

According to a further preferred embodiment, the item of protective equipment comprises a vital signs sensor, wherein vital signs data of the user are transmitted via the third bidirectional communication link to the portable communication device. Hazard situations can thus be detected directly from their effects upon the body.

According to a further preferred embodiment, the portable communication device is designed, upon the transmission of critical vital signs data for the user, to establish a fourth uni- or bidirectional communication link to a rescue center or control room. This permits a rapid rescue, in the event of threatening situations.

According to a further preferred embodiment, at least a proportion of work instructions, the associated respective confirmations or failed confirmations and the respective alarm signal in the event of a failed confirmation are logged and saved in the portable communication device.

According to a further preferred embodiment, the portable communication device comprises a smartphone, a laptop or a tablet, or smart glasses or a smartwatch.

According to a further preferred embodiment, a voltage test point confirmation device is provided for confirming the voltage test point, which is communicatively connected to the portable communication device wherein, prior to the communication of the test result, a check of the voltage test point is executed by the voltage test point confirmation device, and wherein communication of the test result from the portable voltage testing device to the portable communication device is only executed further to a successful check. This prevents any false measurements at an incorrect voltage test point.

According to a further preferred embodiment, the voltage test point confirmation device comprises an imaging device and/or a sensor device which is integrated in the portable voltage testing device.

According to a further preferred embodiment, the item of protective equipment comprises a sensor which is configured to monitor the condition, use or servicing of the item of protective equipment, and to execute the communication thereof via the third bidirectional communication link to the stationary central communication device.

BRIEF DESCRIPTION OF THE DRAWINGS

The present invention is described in greater detail hereinafter, with reference to the exemplary embodiments which are schematically represented in the drawings according to the figures.

In the figures:

FIG. 12 shows a flow diagram of a method for the automatic monitoring of an electrotechnical workflow according to the sixth embodiment of the present invention;

EMBODIMENTS OF THE INVENTION

In the figures, identical reference symbols indicate identical or functionally equivalent elements.

Figure 1:
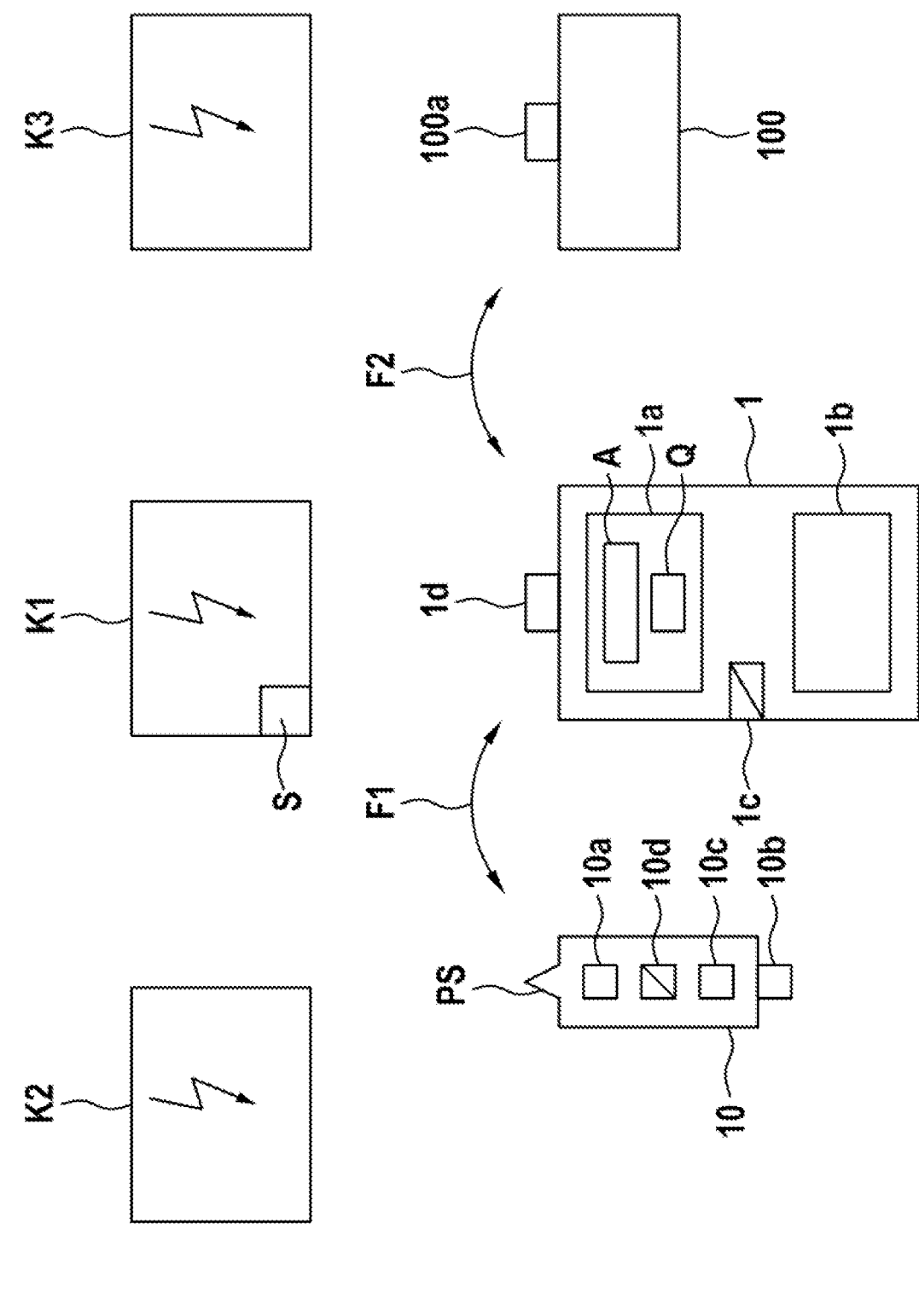
FIG. 1 shows a device for the automatic monitoring of an electrotechnical workflow, according to a first embodiment of the present invention.
Figure 2:
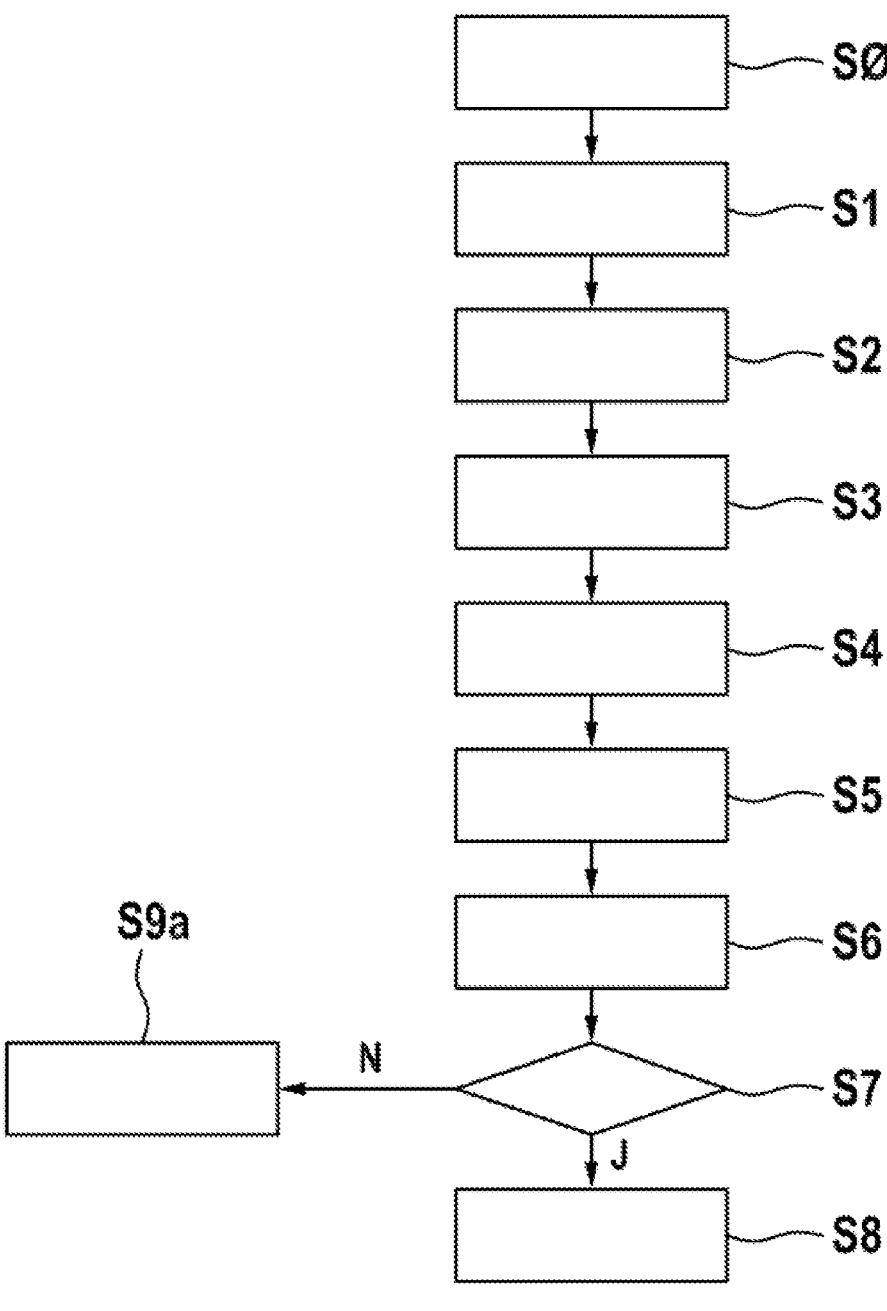
FIG. 2 shows a flow diagram of a method for the automatic monitoring of an electrotechnical workflow, according to the first embodiment of the present invention.

FIG. 1 shows a device for the automatic monitoring of an electrotechnical workflow according to a first embodiment of the present invention, and FIG. 2 shows a flow diagram of a method for the automatic monitoring of an electrotechnical workflow according to the first embodiment of the present invention.

The device for the automatic monitoring of an electrotechnical workflow according to FIG. 1 is equipped with a portable communication device 1, which comprises a first input apparatus 1b, a first output apparatus 1a, a first storage apparatus 1c and a first bidirectional communication interface 1d.

The portable communication device 1 is, for example a smartphone or laptop computer having a GSM connection and a wireless transmission function (e.g. a WLAN function. or a Bluetooth function, a mobile telephone function or similar) for the first bidirectional communication interface 1*d*, wherein the first input apparatus 1*b* can be a keypad or a touchscreen, and the first output apparatus 1*a* can be a monitor.

In the first storage apparatus 1*c*, a step sequence program for the electrotechnical workflow is saved, and is retrievable by means of a corresponding user input. The step sequence program indicates a plurality of work step instructions A which are to be executed by the user and confirmed by means of the confirmation field Q.

The device for the automatic monitoring of an electrotechnical workflow according to FIG. 1 is further equipped with a portable voltage testing device 10, which comprises a second input apparatus 10*c*, a second output apparatus 10*a*, a second storage apparatus 10*d* and a second bidirectional communication interface 10*b*, in this case for a wireless transmission function. The voltage testing device 10 comprises a test probe PS which, for the purposes of voltage testing, is to be applied to a test point which is provided for this purpose, in a contacted or contactless arrangement.

In the second storage apparatus 10*d* of the portable voltage testing device, at least one test parameter is saved and is retrievable and/or adjustable by the portable communication device 1 via the first communication link F1. This test parameter comprises e.g. an acoustic or electronic indicator setting of the second output apparatus 10*a* and/or an additional function and/or a rated data parameter, particularly a voltage measurement range and/or a battery capacity and/or a mandatory test time for retesting and/or an operational availability of the portable voltage testing device. 10.

By means of the work step sequence program, a first bidirectional communication link F1 between the portable communication device 1 and the portable voltage testing device 10 can be established via the first bidirectional communication interface 1*d* and the second bidirectional communication interface 10*b*.

A second bidirectional communication link F2 between the portable communication device 1 and a stationary central communication device 100 having a third bidirectional communication interface 100*a* can be established via the first bidirectional communication interface 1*d* and the third bidirectional communication interface 100*a*, in this case also a wireless transmission function (e.g. a WLAN function or a WLAN/Internet function). The stationary central communication device 100 is, for example, a local application server or a central provider server.

In the present case, the electrotechnical workflow is executed on an energized electronic component K1, for example a distributor cabinet or, in the case of switching operations, on electrical installations (e.g. low-voltage or high-voltage installation in the interior or exterior, or openwire/overhead lines), which comprises a voltage switch S for isolation, i.e. for the interruption of the voltage supply to the electronic component K1.

In the vicinity of the energized electronic component K1, adjoining energized electronic components K2, K3 are located, which are addressed in greater detail hereinafter.

With reference to FIG. 1, in step S0, initialization is executed on the portable communication device 1 by a corresponding user input on the first input apparatus 1*b*. The first bidirectional communication link F1 is thus established between the portable communication device 1 and the portable voltage testing device 10.

Alternatively, an automatic connection can also be established, with a subsequent acknowledgement by the portable communication device.

Optionally, the at least one test parameter can be retrieved and/or adjusted by the portable communication device 1 via the first communication link F1.

In step S1, start-up of the work step sequence program is executed on the portable communication device 1 by means of a further user input on the first input apparatus 1*b* of the portable communication device 1.

Thereafter, in step S2, an output S2 of a work step instruction of the plurality of work step instructions A is delivered for the isolation of the energized electronic component K1, thereby isolating the electronic component K1 from supply, e.g. by the alteration of the position of the voltage switch S or of a corresponding software switch by means of the wireless communication function, by the running of the work step sequence program, on the first output apparatus 1*a* of the portable communication device 1.

Further to the execution of isolation, in step S3, manual confirmation S3 of the isolation of the electronic component K1 is executed on the portable communication device by means of a user input on the confirmation field Q.

Further to the confirmation of the isolation of the electronic component K1 in step S3, in step S4, an output of a further work step instruction of the plurality of work step instructions A is delivered for checking the isolation from supply of the electronic component K1 by means of the portable voltage testing device 10, on the first output apparatus 1*a* of the portable communication device 1, by the work step sequence program.

In step S5, the user then executes the checking of the isolation from supply of the electronic component K1 by means of the portable voltage testing device 10, wherein the test probe PS for voltage testing is applied to the test point which is provided for this purpose and voltage testing is initiated, e.g. by depressing a corresponding key on the second input apparatus 10*c*.

Alternatively, the voltage testing device 10, further to the switch-on thereof, is automatically displaced to a measuring state, optionally after self-testing.

Thereafter, in step S6, communication S6 of the test result is executed from the portable voltage testing device 10 to the portable communication device 1 via the first bidirectional communication link F1.

In step S7, the test result is checked by work step sequence program of the portable communication device 1.

In the event that the test result indicates isolation from supply (J in step S7), in step S8, automatic confirmation of the checking of the isolation from supply of the electronic component K1 is executed by the delivery of an output of a confirmation signal by the portable communication device, which optionally initiates the output of a further work step instruction of the plurality of work step instructions A or the termination of the work step sequence program.

In the event that the test result does not indicate isolation from supply (N in step S7), in step S9*a*, an output of a first alarm signal is delivered by the portable communication device 1 via the first output apparatus 1*a*, e.g. in the form of an optical and/or acoustic signal, and the potential output of a further work step instruction of the plurality of work step instructions A is inhibited.

Figure 3:
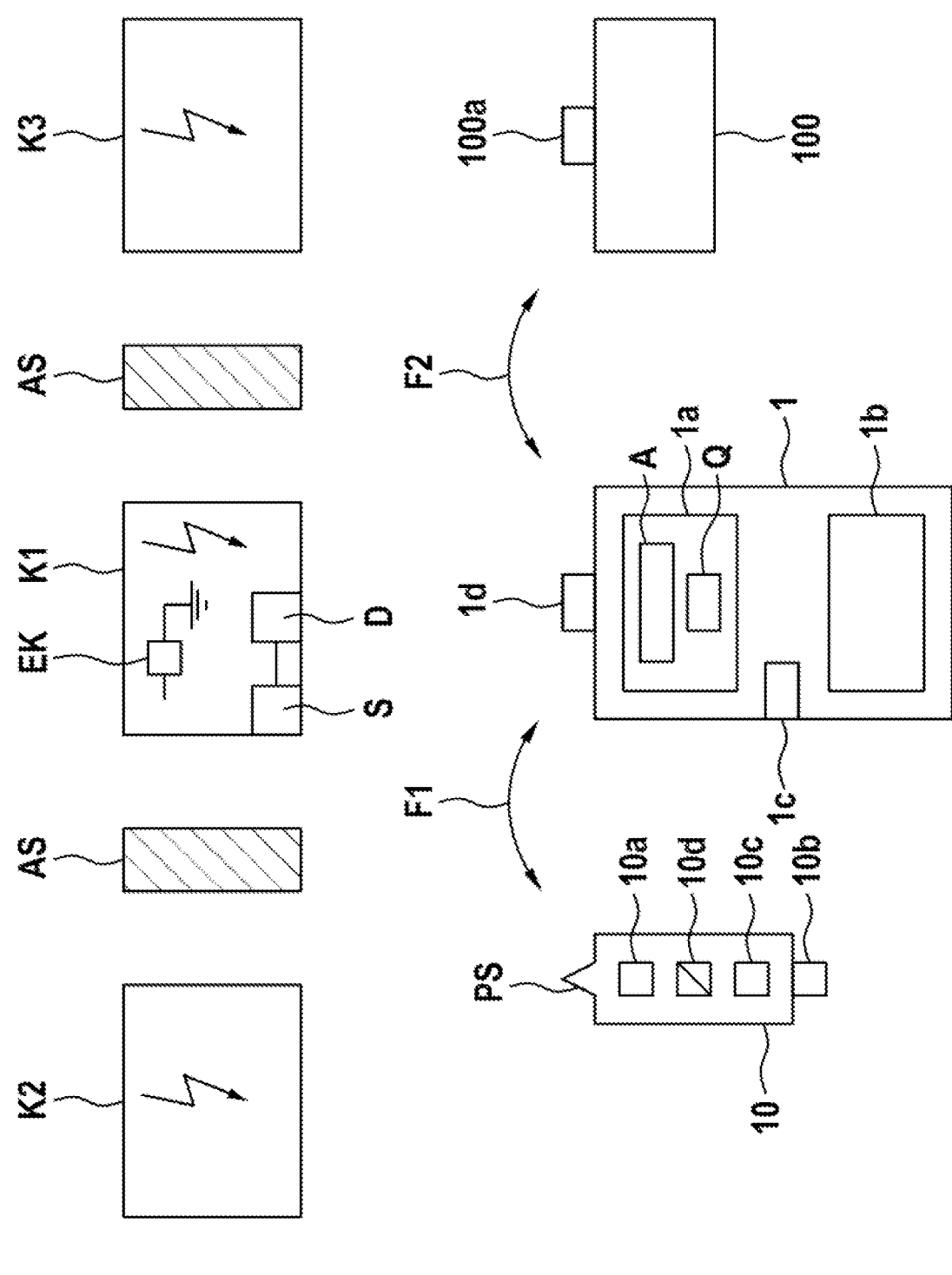
FIG. 3 shows a device for the automatic monitoring of an electrotechnical workflow, according to a second embodiment of the present invention.
Figure 4:
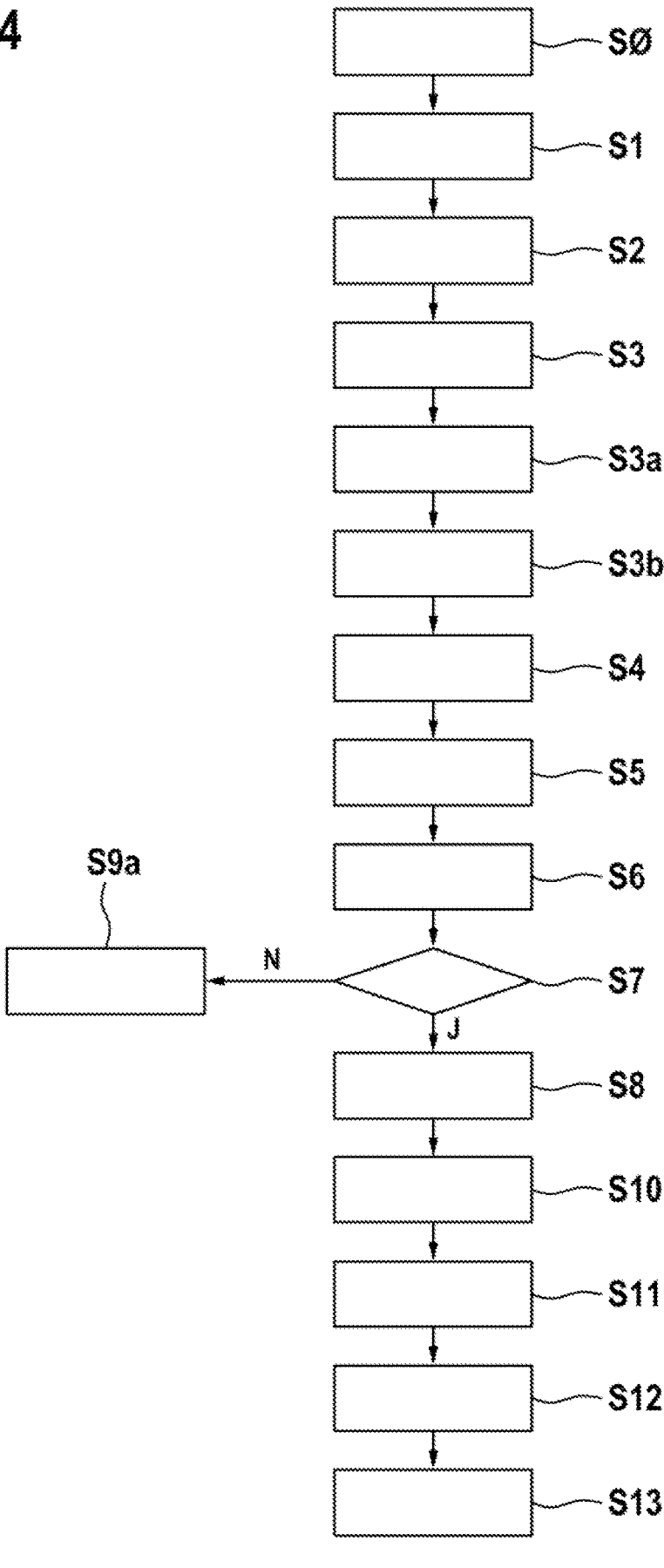
FIG. 4 shows a flow diagram of a method for the automatic monitoring of an electrotechnical workflow according to the second embodiment of the present invention.

FIG. 3 shows a device for the automatic monitoring of an electrotechnical workflow according to a second embodiment of the present invention, and FIG. 4 shows a flow diagram of a method for the automatic monitoring of an electrotechnical workflow according to the second embodiment of the present invention.

The device for the automatic monitoring of an electrotechnical workflow according to FIG. 3 differs from the device according to FIG. 1, in that the electronic component K1 comprises a safeguard device for the protection of the electronic component K1 against reclosing and which, in the present example, is a stationary or portable lock D, which is to be actuated by the user in the context of the workflow.

Moreover, a clamping device EK for the grounding and short-circuiting of the electronic component K1 and a barrier device AS for the safeguarding and barrier protection of adjoining energized electronic components K2, K3 are applied by the user.

According to FIG. 4, steps S0 to S3 are firstly executed, as described above in conjunction with the first embodiment.

Further to the confirmation of the isolation of the electronic component K1 in step S3, and prior to the output of the work step instruction of the plurality of work step instructions A for checking the isolation from supply of the electronic component K1 in step S4, steps S3*a* and S3*b* are additionally executed in the second embodiment.

In step S3*a*, an output S3*a* of a work step instruction of the plurality of work step instructions A is delivered for safeguarding the electronic component K1 against reclosing by the work step sequence program wherein, in the present case, the lock D is to be employed by the user.

Further to the safeguarding of the electronic component K1 against reclosing, in step S3*b*, manual confirmation S3*b* of the safeguarding of the electronic component K1 against reclosing is executed on the portable communication device 1, by means of a user input on the confirmation field Q.

Steps S4 to S8 or S4 to S9*a* are then executed, as described above.

In the event that the test result indicates isolation from supply, and the output of the confirmation signal has been delivered by the portable communication device 1 in step S8, in step S10, an output S10 is delivered of a work step instruction of the plurality of work step instructions A for the grounding and short-circuiting of the electronic component K1 by the work step sequence program wherein, in the present case, the clamping device EK is to be employed by the user.

Further to the grounding and short-circuiting of the electronic component K1, in step S11, manual confirmation of the grounding and short-circuiting of the electronic component K1 is executed on the portable communication device 1, by means of a user input on the confirmation field Q.

Further to the confirmation of the grounding and short-circuiting of the electronic component K1 in step S11, an output S12 of a work step instruction of the plurality of work step instructions A is delivered for the safeguarding and barrier protection of adjoining energized electronic components K2, K3 by the work step sequence program, in the present case by the employment of a barrier device AS.

Further to safeguarding and barrier protection, in step S13, manual confirmation of the safeguarding and barrier protection of adjoining energized electronic components K2, K3 is executed on the portable communication device 1 via a user input on the confirmation field Q.

Figure 5:
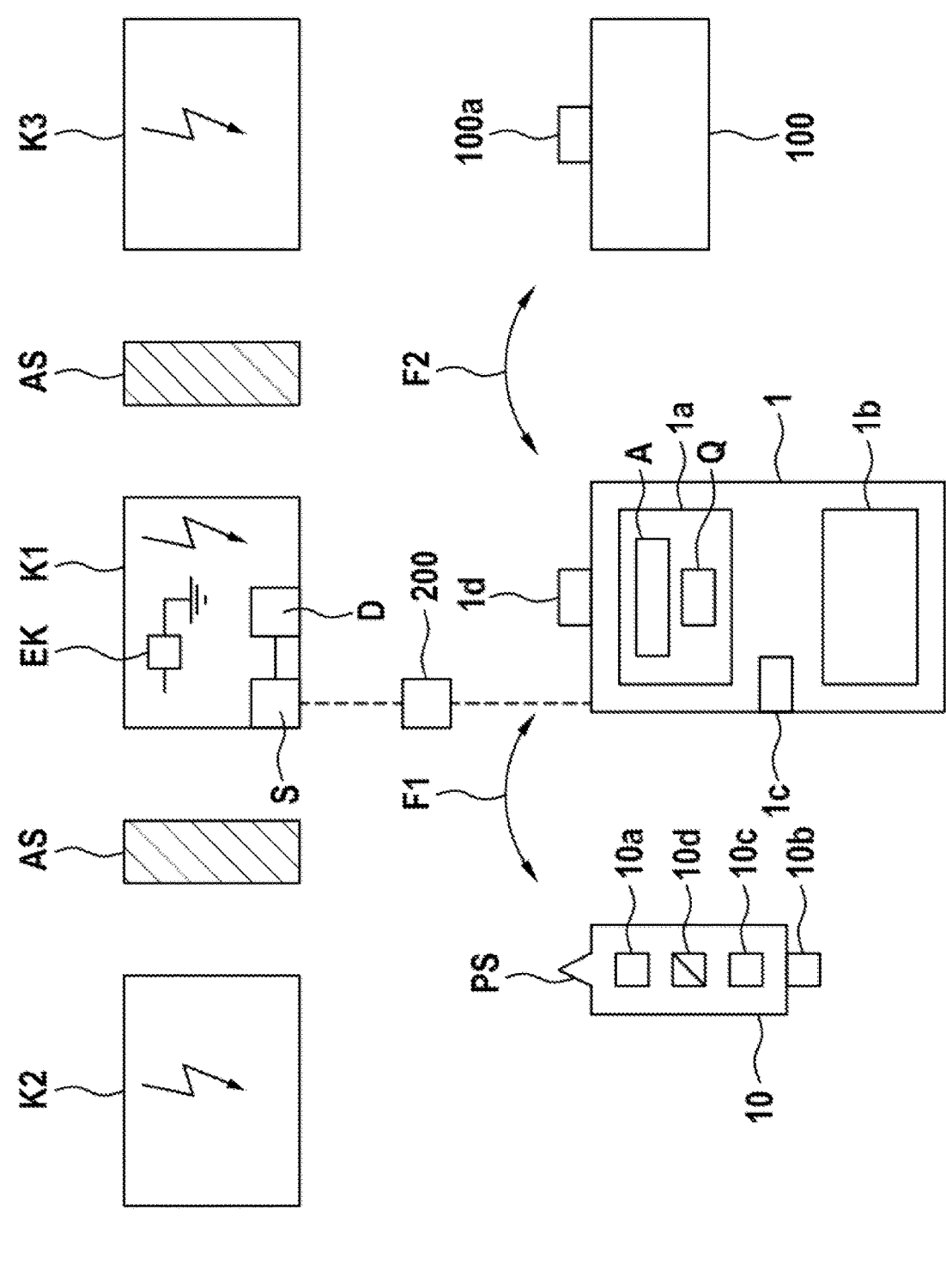
FIG. 5 shows a device for the automatic monitoring of an electrotechnical workflow according to the third embodiment of the present invention.
Figure 6:
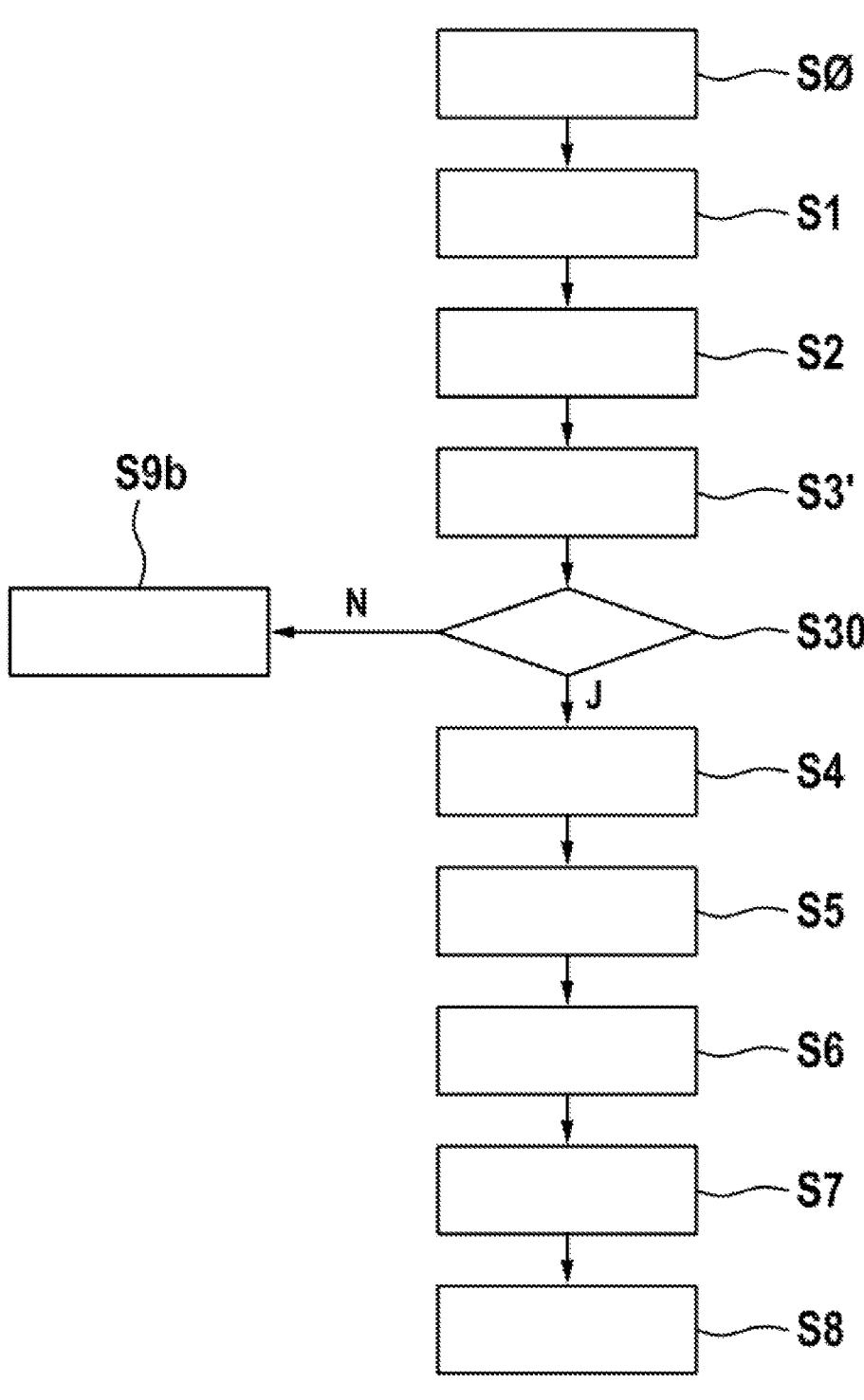
FIG. 6 shows a flow diagram of a method for the automatic monitoring of an electrotechnical workflow according to the third embodiment of the present invention.

FIG. 5 shows a device for the automatic monitoring of an electrotechnical workflow according to a third embodiment of the present invention, and FIG. 6 shows a flow diagram of a method for the automatic monitoring of an electrotechnical workflow according to the third embodiment of the present invention.

The device for the automatic monitoring of an electrotechnical workflow according to FIG. 5 differs from the device according to FIG. 1, in that confirmation S3' of the isolation of the electronic component K1 is executed automatically by an isolation confirmation device 200 which is communicatively connected to the portable communication device 1, and not manually by the user. Automatic confirmation S3' can be initiated by a user input on the confirmation field Q, further to the output of the work step instruction of the plurality of work step instructions A for the isolation of an energized electronic component K1 in step S2.

The isolation confirmation device 200, for example, is also equipped with a wireless transmission function and/or is connected by wiring or partial wiring to the voltage switch S and the portable communication device 1.

According to FIG. 6, in step S30, confirmation is checked by the work step sequence program. In the event of successful confirmation (J in step S30), the work step sequence program proceeds to step S4 and the following steps, as described above.

In the event of failed confirmation (N in step S30), in step S9*b*, an output of a second alarm signal is delivered by the mobile communication device 1, and the output of further work step instructions of the plurality of work step instructions A is inhibited.

The isolation confirmation device 200 comprises, for example, an imaging device and/or a circuit state indicator device of the voltage switch S which is to be actuated for the purposes of isolation and/or an electroluminescence measurement device for measuring an electric field on the electronic component K1.

Figure 7:
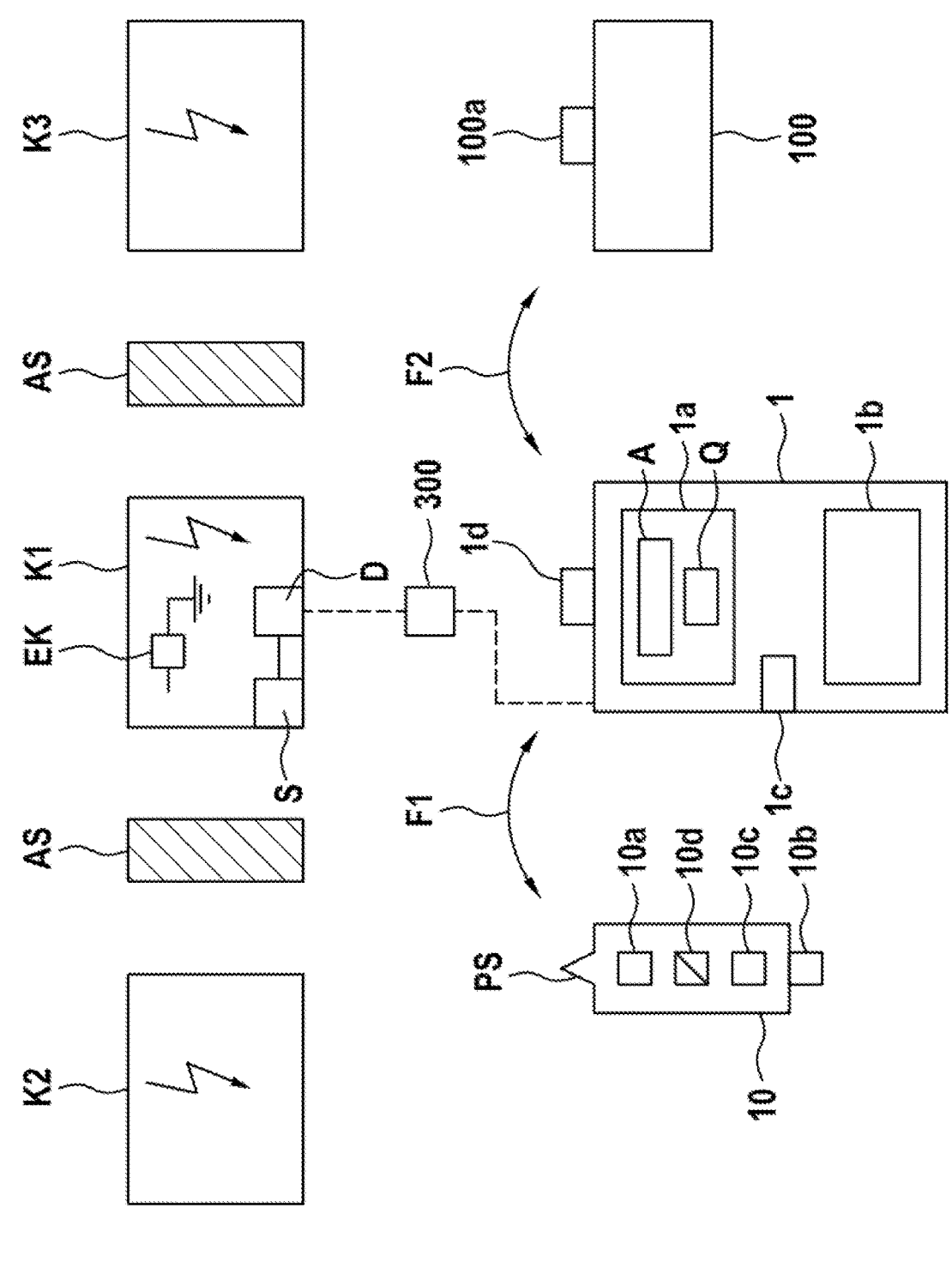
FIG. 7 shows a device for the automatic monitoring of an electrotechnical workflow according to a fourth embodiment of the present invention.
Figure 8:
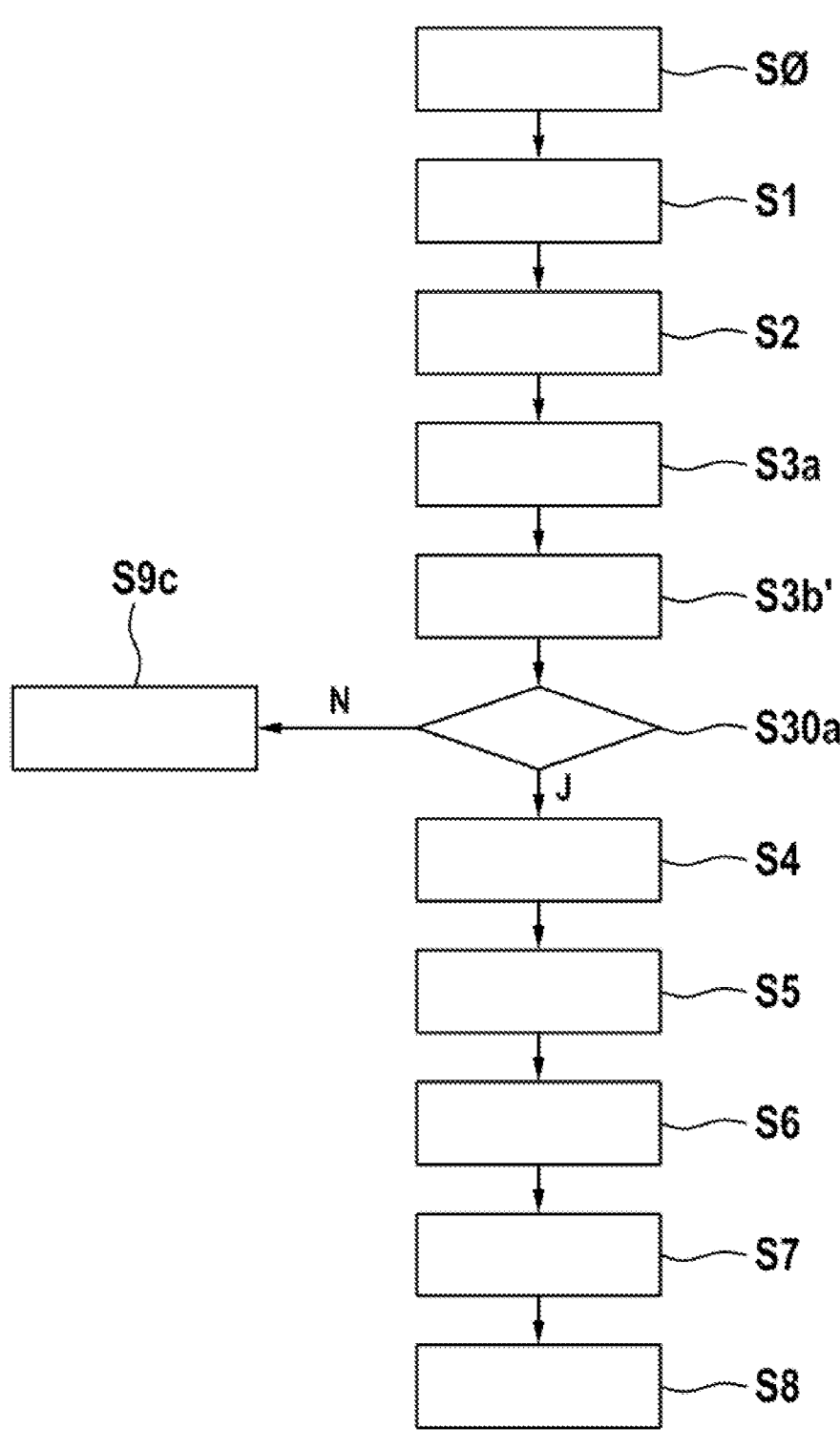
FIG. 8 shows a flow diagram of a method for the automatic monitoring of an electrotechnical workflow according to the fourth embodiment of the present invention.

FIG. 7 shows a device for the automatic monitoring of an electrotechnical workflow according to a fourth embodiment of the present invention, and FIG. 8 shows a flow diagram of a method for the automatic monitoring of an electrotechnical workflow according to the fourth embodiment of the present invention.

The device for the automatic monitoring of an electrotechnical workflow according to FIG. 7 differs from the device according to FIG. 3, in that confirmation S3*b*' of the safeguarding of the electronic component K1 against reclosing is executed automatically by a reclosing protection confirmation device 300 which is communicatively connected to the portable communication device 1, and not manually by the user. Automatic confirmation S3*b*' can be initiated by a user input on the confirmation field Q, further to the output of the work step instruction of the plurality of work step instructions A for safeguarding the electronic component K1 against reclosing.

The reclosing protection confirmation device 300 is, for example, also equipped with a wireless transmission function and/or is connected by wiring or partial wiring to the lock D and the portable communication device 1.

According to FIG. 8, in step S30*a*, confirmation is checked by the work step sequence program. In the event of successful confirmation (J in step S30*a*), the work step sequence program proceeds to step S4 and the following steps, as described above.

In the event of failed confirmation (N in step S30*a*), in step S9*c*, an output of a third alarm signal is delivered by the portable communication device 1, and the output of further work step instructions of the plurality of work step instructions A is inhibited.

The reclosing protection confirmation device 300 comprises, for example, an imaging device and/or a lock-out status notification device of the lock D which is to be actuated for protection against reclosing.

Figure 9:
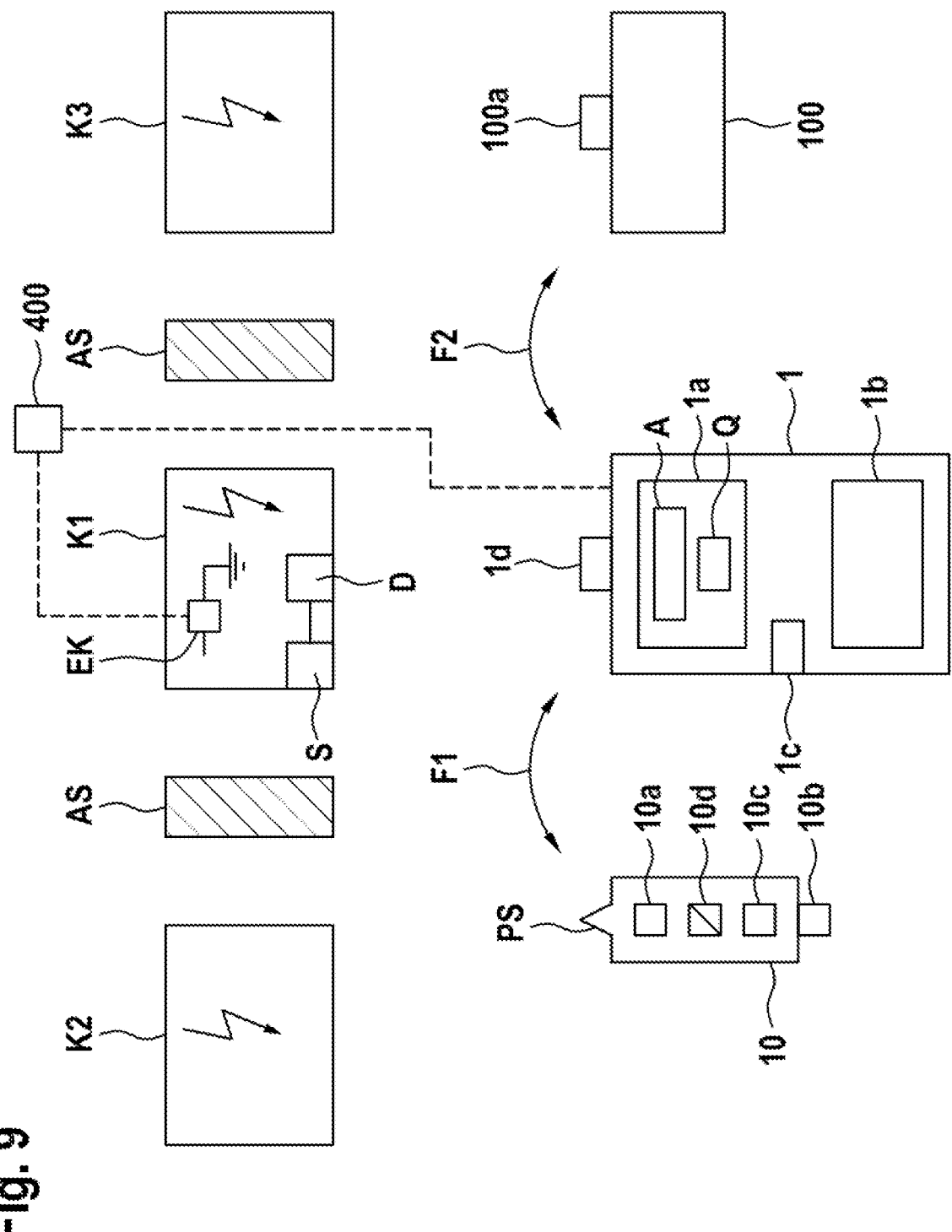
FIG. 9 shows a device for the automatic monitoring of an electrotechnical workflow according to a fifth embodiment of the present invention.
Figure 10:
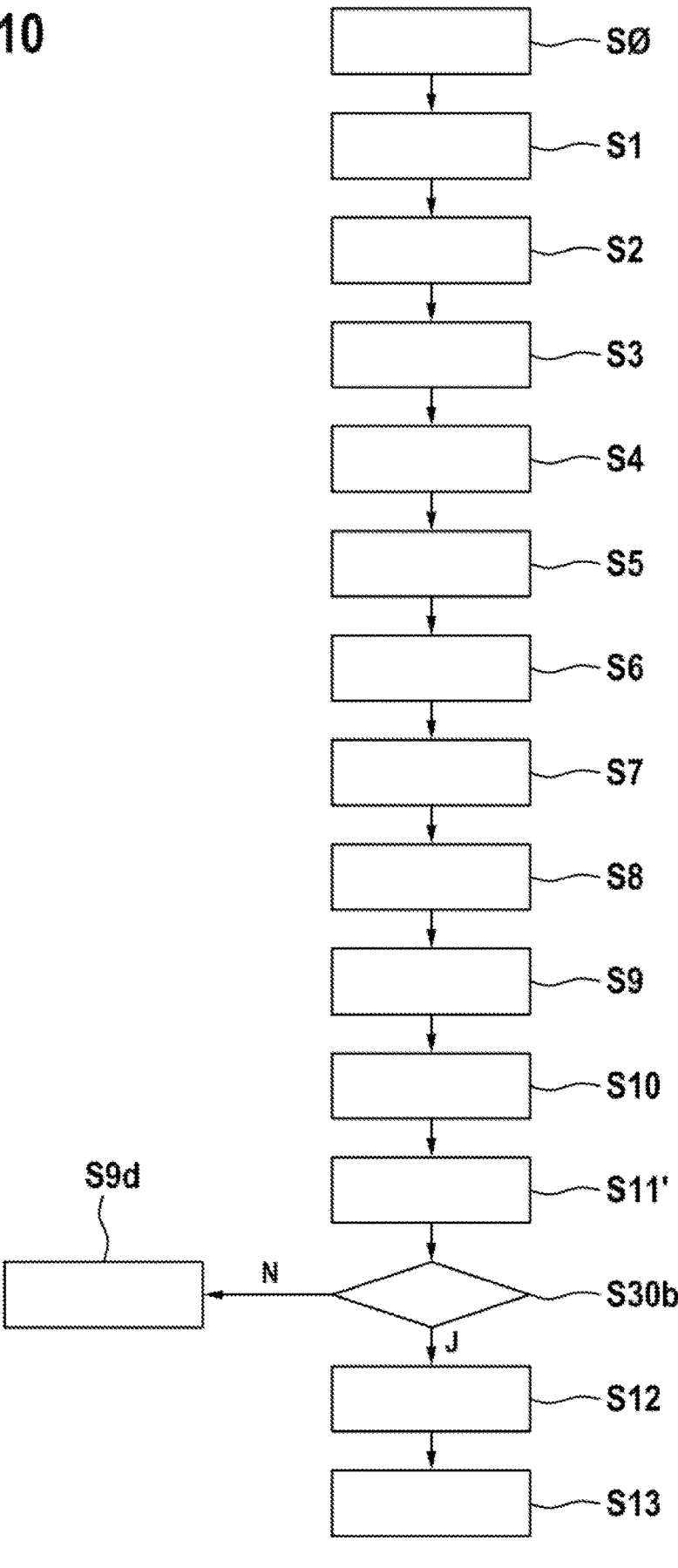
FIG. 10 shows a flow diagram of a method for the automatic monitoring of an electrotechnical workflow according to the fifth embodiment of the present invention.

FIG. 9 shows a device for the automatic monitoring of an electrotechnical workflow according to a fifth embodiment of the present invention, and FIG. 10 shows a flow diagram of a method for the automatic monitoring of an electrotechnical workflow according to the fifth embodiment of the present invention.

The device for the automatic monitoring of an electrotechnical workflow according to FIG. 9 differs from the device according to FIG. 3, in that confirmation S11' of the grounding and short-circuiting of the electronic component K1 is executed automatically by a grounding/short-circuiting confirmation device 400 which is communicatively connected to the portable communication device 1, and not manually by the user. Automatic confirmation S1*l*' can be initiated by a user input on the confirmation field Q, further to the output of the work step instruction of the plurality of work step instructions A for the grounding and short-circuiting of the electronic component K1.

The grounding/short-circuiting confirmation device 400, for example, is also equipped with a wireless transmission function and/or is connected by wiring or partial wiring to the clamping device EK and the portable communication device 1.

According to FIG. 10, in step S30*b*, confirmation is checked by the work step sequence program. In the event of successful confirmation (J in step S30*b*), the work step sequence program proceeds to step S12 and the following steps, as described above.

In the event of failed confirmation (N in step S30*b*), in step 9*d*, an output of a fourth alarm signal is delivered by the portable communication device 1, and the output of further work step instructions of the plurality of work step instructions A is inhibited.

The grounding/short-circuiting confirmation device 400 comprises, for example, an imaging device and/or a clamp detection device (e.g. a pressure switch, a limit switch or similar) for detecting the clamping of a clamping device EK which is employed for grounding and short-circuiting and/or a device for detecting fixed ball points on a ball-head cap of the clamping device EK.

Figure 11:
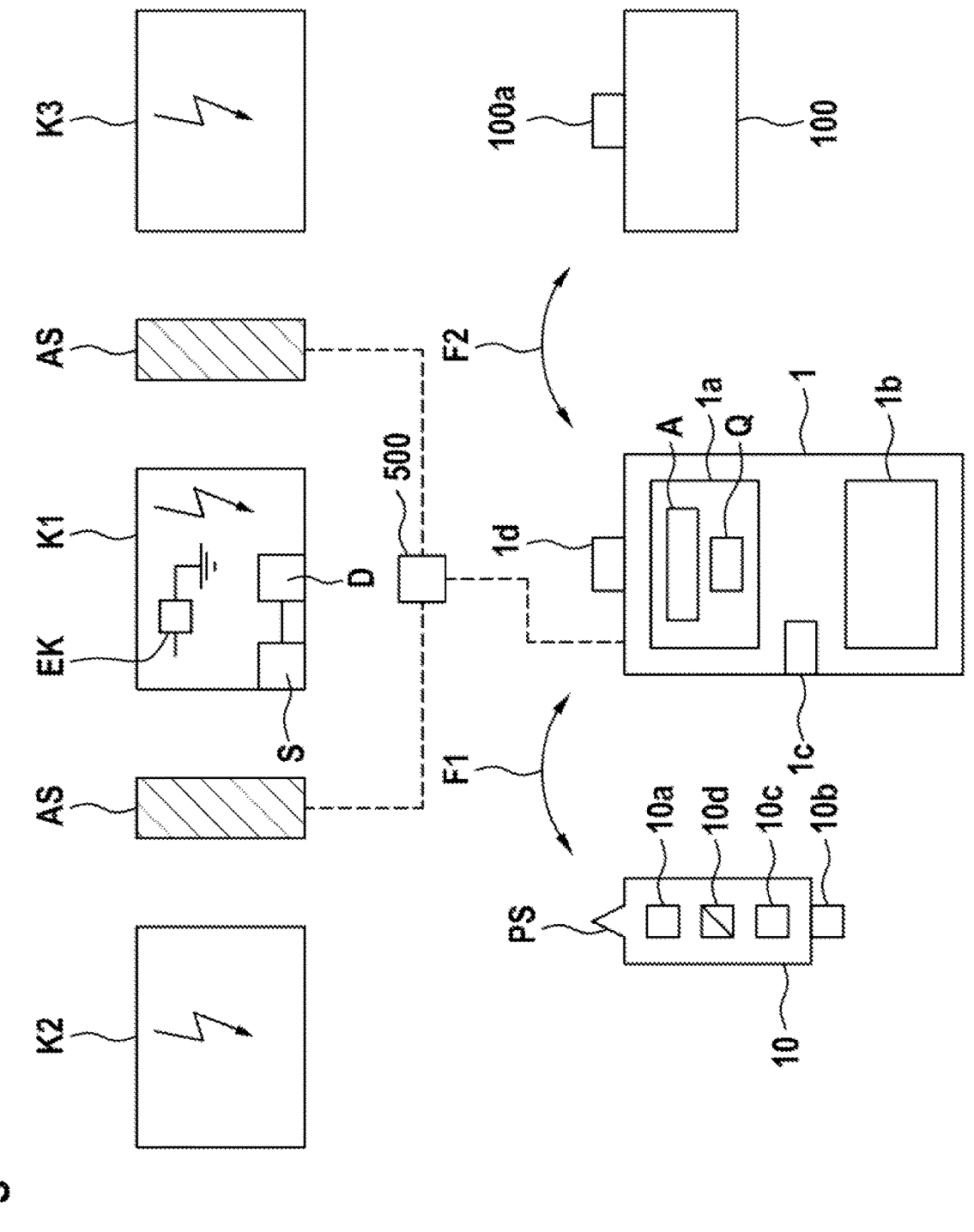
FIG. 11 shows a device for the automatic monitoring of an electrotechnical workflow according to a sixth embodiment of the present invention.
Figure 12:
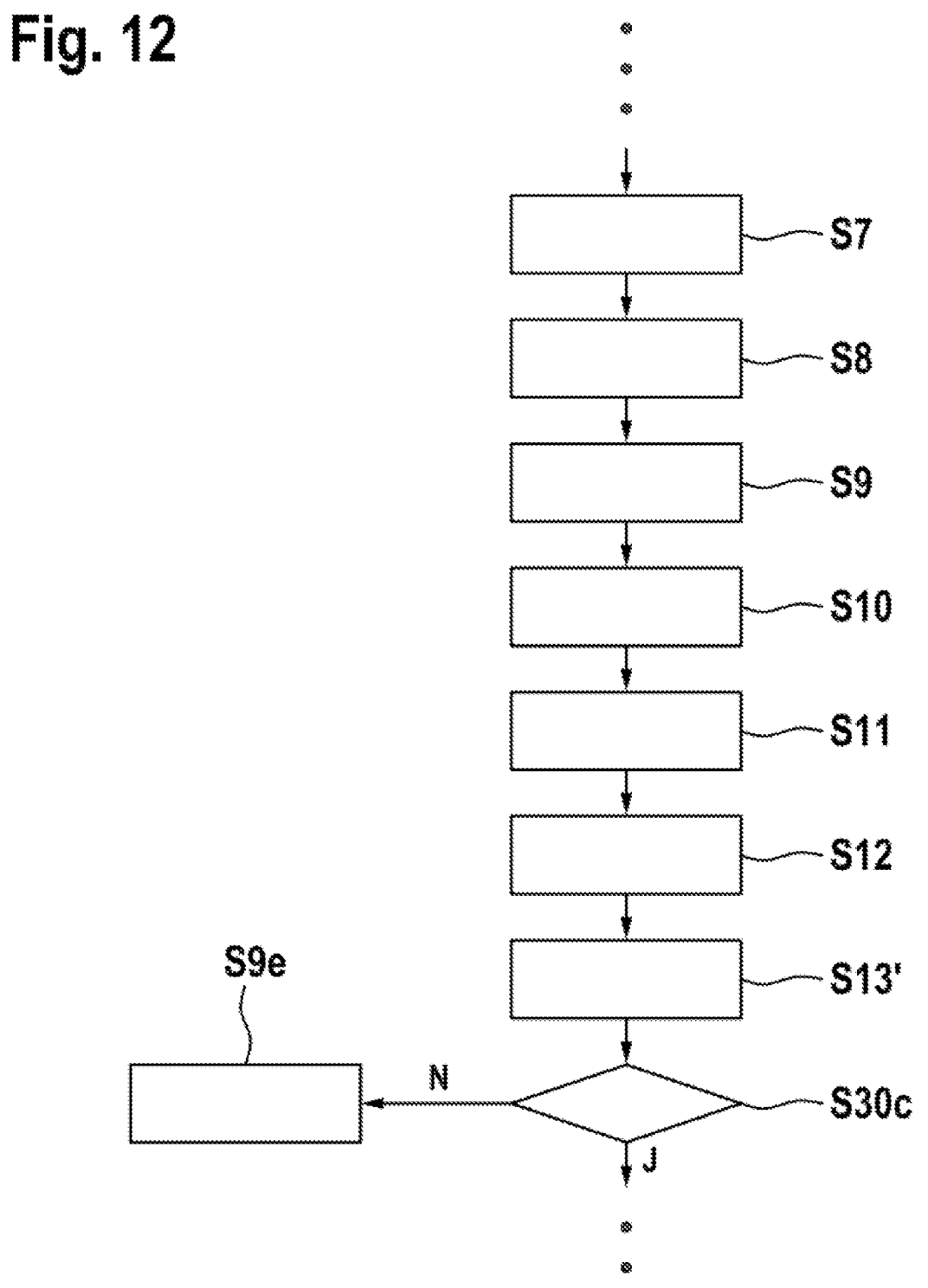

FIG. 11 shows a device for the automatic monitoring of an electrotechnical workflow according to a sixth embodiment of the present invention, and FIG. 12 shows a flow diagram of a method for the automatic monitoring of an electrotechnical workflow according to the sixth embodiment of the present invention.

The device for the automatic monitoring of an electrotechnical workflow according to FIG. 11 differs from the device according to FIG. 3, in that confirmation S13' of the safeguarding and barrier protection of adjoining energized electronic components K2, K3 is executed automatically by a safeguarding/barrier protection confirmation device 500 which is communicatively connected to the portable communication device 1, and not manually by the user. Automatic confirmation S13' can be initiated by a user input on the confirmation field Q, further to the output of the work step instruction of the plurality of work step instructions A for the safeguarding and barrier protection of the electronic component K1.

The safeguarding/barrier protection confirmation device 500, for example, is also equipped with a wireless transmission function and/or is connected by wiring or partial wiring to the barrier device AS and the portable communication device 1.

According to FIG. 12, in step S30*c*, confirmation is checked by the work step sequence program. In the event of successful confirmation (J in step S30*c*), the work step sequence program proceeds to any further work step instructions, or is terminated.

In the event of failed confirmation (N in step 30*c*), in step S9*e*, an output of a fifth alarm signal is delivered by the portable communication device 1, and the output of further work step instructions of the plurality of work step instructions A is inhibited.

The safeguarding/barrier protection confirmation device 500 comprises, for example, an imaging device and/or a position detection device of a position of the barrier device AS which is employed for safeguarding and barrier protection.

Figure 13:
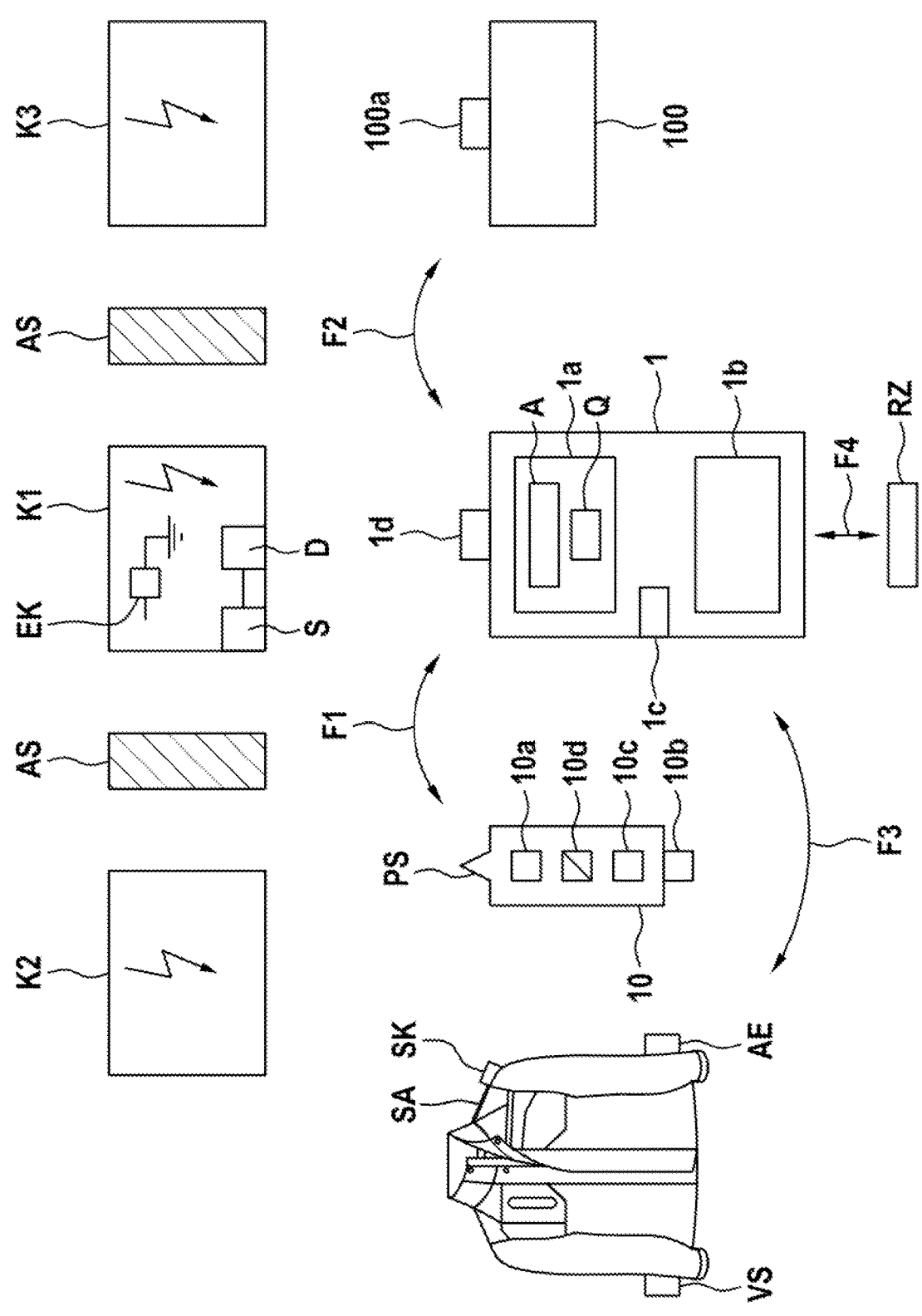
FIG. 13 shows a device for the automatic monitoring of an electrotechnical workflow according to a seventh embodiment of the present invention.

FIG. 13 shows a device for the automatic monitoring of an electrotechnical workflow according to a seventh embodiment of the present invention.

The device for the automatic monitoring of an electrotechnical workflow according to FIG. 13 differs from the device according to FIG. 3, in that an item of protective equipment SA is provided for a user, which comprises a third bidirectional communication interface VS.

A third bidirectional communication link F3 can be established between the portable communication device 1 and the item of protective equipment SA via the first bidirectional communication interface 1*d* and the third bidirectional communication interface VS in the work step sequence program.

The portable communication device 1 transmits at least one of the first to fifth alarm signals via the third bidirectional communication link F3 to the item of protective equipment SA, for the triggering of an optical and/or acoustic warning device AE and/or a vibration alarm device which is fitted to the item of protective equipment SA. The item of protective equipment SA is e.g. a safety jacket, a safety helmet, safety goggles, a safety coat, protective overalls, a protective coat, or similar.

The item of protective equipment SA further comprises a vital signs sensor VS, and vital signs data for the user are transmittible via the third bidirectional communication link F3 to the portable communication device 1. The portable communication device 1 is designed, upon the transmission of critical vital signs data for a user, to establish a fourth bidirectional communication link F4 to a rescue center RZ, e.g. by means of the GSM function.

The item of protective equipment SA can also comprise e.g. further (unrepresented) sensors for the enhancement of safety, e.g. a humidity sensor, a motion sensor, an acceleration sensor, etc., which can inhibit or interrupt a work step instruction via a wireless communication link.

Figure 14:
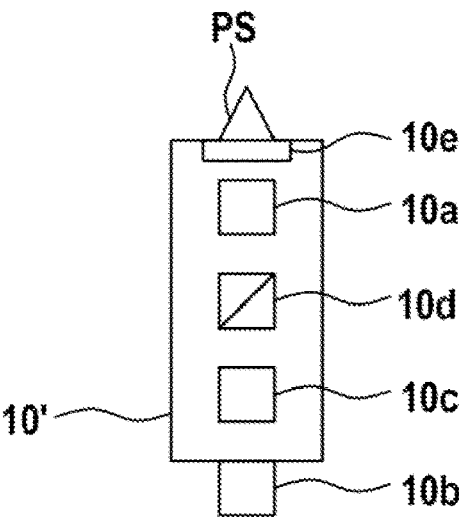
FIG. 14 shows a voltage testing device of a device for the automatic monitoring of an electrotechnical workflow according to an eighth embodiment of the present invention.
Figure 15:
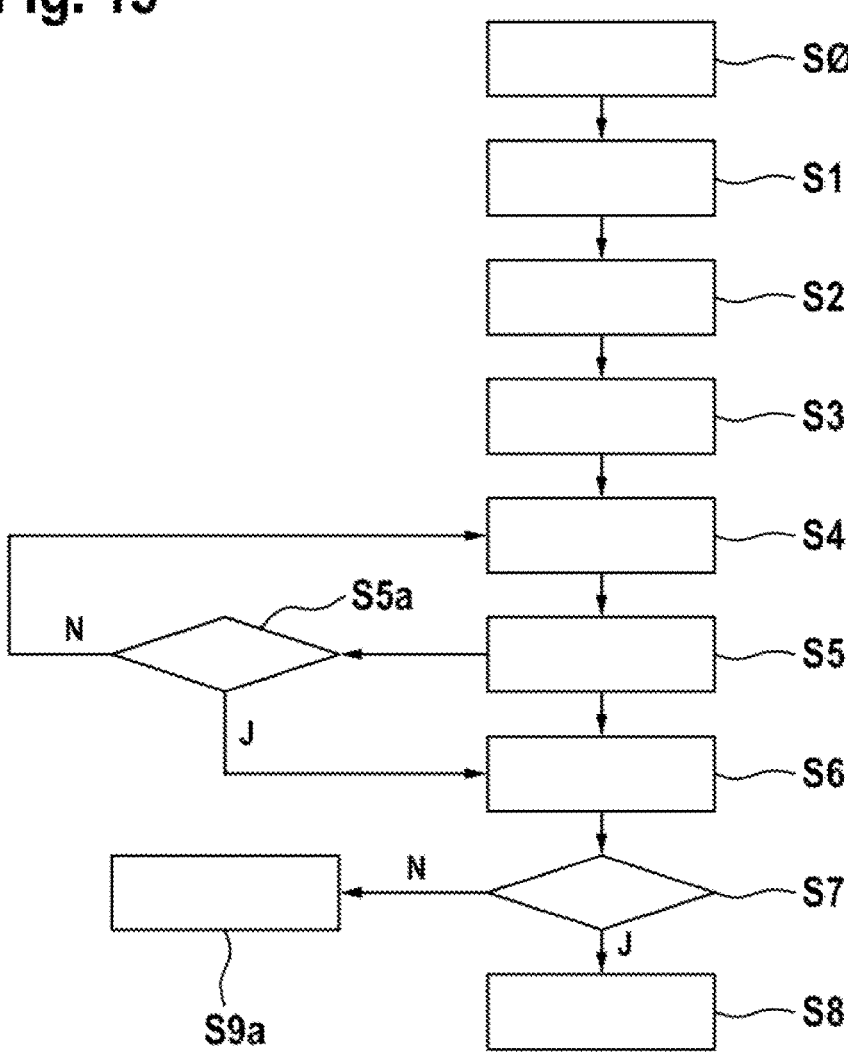
FIG. 15 shows a flow diagram of a method for the automatic monitoring of an electrotechnical workflow according to the eighth embodiment of the present invention.

FIG. 14 shows a voltage testing device of a device for the automatic monitoring of an electrotechnical workflow according to an eighth embodiment of the present invention, and FIG. 15 shows a flow diagram of a method for the automatic monitoring of an electrotechnical workflow according to the eighth embodiment of the present invention.

The portable voltage testing device 10' according to FIG. 14 is communicatively connected to the portable communication device 1. It comprises a voltage test point confirmation device 10*e* for confirming the correct voltage test point, for example an imaging device and/or a sensor device which is integrated in the portable voltage testing device.

According to FIG. 15, further to steps S0 to S5, as described above, i.e. prior to the communication of the test result in step S6, a check of the voltage test point by the voltage test point confirmation device 10*e* is additionally executed in step S5*a*, in order to confirm that the voltage has been measured at the voltage test point provided for this purpose, or that the voltage testing device 10' has been operated correctly.

In the event of a successful test (J in step S5*a*), in step S6, communication of the test result is executed from the portable voltage testing device 10' to the portable communication device 1. Otherwise, the work step sequence program springs back to step S4.

Although the present invention has been described with reference to preferred embodiments, it is not restricted thereto, but is generally applicable to any arbitrary electrotechnical workflows in which a portable voltage measuring device is employed.

The invention claimed is:

1. A method for the automatic monitoring of an electrotechnical workflow having a plurality of work steps, the method comprising:

establishing (S0) of a first bidirectional communication link (F1) between a portable communication device (1) and a portable voltage testing device (10; 10');

starting (S1) of a work step sequence program on the portable communication device (1) by means of an input apparatus (1*b*) of the portable communication device (1);

outputting (S2) of a first work step instruction of a plurality of work step instructions (A) of the work step sequence program for the isolation of an energized electronic component (K1) from a supply to cause the electronic component (K1) to be de-energized on an output apparatus (1*a*) of the portable communication device (1) by the work step sequence program;

automatically or manually confirming (S3; S3') the isolation of the electronic component (K1) on the portable communication device (1);

after confirming (S3; S3') the isolation of the electronic component (K1), generating (S4) a second work step instruction of the plurality of work step instructions (A) for checking the isolation from the supply of the electronic component (K1) by means of the portable voltage testing device (10; 10') on the output apparatus (1*a*) of the portable communication device (1) by the work step sequence program;

checking (S5) the isolation from the supply of the electronic component (K1) by means of the portable voltage testing device (10; 10'), the portable voltage testing device (10; 10') generating a test result in response thereto, the test result indicating that the electronic component (K1) is or is not in isolation from the supply;

communicating (S6) the test result from the portable voltage testing device (10; 10') to the portable communication device (1);

wherein, in the event that the test result indicates that the electronic component (K1) is in isolation from the supply, automatically confirming (S8) the isolation from the supply of the electronic component (K1) by outputting a confirmation signal by the portable communication device (1); and wherein, in the event that the test result indicates that the electronic component (K1) is not in isolation from the supply, outputting (S9*a*) a first alarm signal by the portable communication device (1).

2. The method as claimed in claim 1, wherein a second bidirectional communication link (F2) is set up between the portable communication device (1) and a stationary central communication device (100), and wherein the test result is communicated by the portable voltage testing device (10; 10') to the stationary central communication device (100).

3. The method as claimed in claim 1, wherein at least one test parameter which is savable in the portable voltage testing device (10; 10') is at least one of retrievable and adjustable by the portable communication device (1).

4. The method as claimed in claim 3, wherein the test parameter comprises at least one of an acoustic or electronic indicator setting, an additional function, a rated data parameter, a battery capacity, a mandatory test time for retesting and an operational availability of the portable voltage testing device (10; 10').

5. The method as claimed in claim 1, wherein the portable communication device (1) is designed, upon the transmission of the vital signs data of the user, to establish a third uni- or bidirectional communication link (F4) to a rescue center (RZ).

6. The method as claimed in claim 1, wherein the portable communication device (1) comprises a time logging device, and checking (S5) of the isolation from the supply of the electronic component (K1) using the portable voltage testing device (10; 10') is logged on a time basis by the work step sequence program and saved in the portable communication device (1).

7. The method as claimed in claim 1, wherein the portable communication device (1) comprises a GPS location device, and checking (S5) of the isolation from the supply of the electronic component (K1) using the portable voltage testing device (10; 10') is logged geographically by the work step sequence program and saved in the portable communication device (1).

8. The method as claimed in claim 1, wherein the portable communication device (1) comprises a weather forecasting device and, in the event of a predefined weather forecast, a warning indication is generated in the work step sequence program.

9. The method as claimed in claim 1, wherein the confirming step (S3') of the isolation of the electronic component (K1) is executed automatically by an isolation confirmation device (200) which is communicatively connected to the portable communication device (1), wherein, in the event of a failed confirmation of the confirming step (S3'), output (S9*b*) of a second alarm signal is generated by the portable communication device (1), and wherein the isolation confirmation device (200) comprises at least one of an imaging device, a circuit state indicator device of the hardware, a software voltage switch(S) which is to be actuated for isolation and an electroluminescence measurement device for measuring an electric field on the electronic component (K1).

10. The method as claimed in claim 1 wherein, further to a confirmation of the confirming step (S3; S3') of the isolation of the electronic component (K1) and prior to the generation (S4) of the work step instruction (A) for the checking the isolation from supply of the electronic component (K1), output (S3*a*) of a work step instruction (A) for safeguarding the electronic component (K1) against reclosing is generated by the work step sequence program, followed by an automatic or manual confirmation (S3*b*; S3*b*') of the safeguarding of the electronic component (K1) against reclosing on the portable communication device (1).

11. The method as claimed in claim 10, wherein a confirmation of the confirming step (S3*b*') of the safeguarding of the electronic component (K1) against reclosing is executed automatically by a reclosing protection confirmation device (300) which is communicatively connected to the portable communication device (1) and, in the event of a failed confirmation of the confirming step (S3*b*), output (S9*c*) of a second alarm signal is generated by the portable communication device (1), and wherein the reclosing protection confirmation device (300) comprises at least one of an imaging device and a lock-out status notification device of a lock (D) which is to be actuated for protection against reclosing.

12. The method as claimed in claim 1 wherein, in the event that the test result indicates isolation from the supply and a confirmation signal is generated by the portable communication device (1), output (S10) of a third work step instruction of the plurality of work step instructions (A) for a grounding and short-circuiting of the electronic component (K1) is generated by the work step sequence program, followed by automatic or manual confirmation (S11; S11') of the grounding and short-circuiting of the electronic component (K1) on the portable communication device (1).

13. The method as claimed in claim 12, wherein a confirmation (S11') of the grounding and short-circuiting of the electronic component (K1) is executed automatically by a grounding/short-circuiting confirmation device (400) which is communicatively connected to the portable communication device (1) and, in the event of a failed confirmation (S11'), output (S9d) of a second alarm signal is generated by the portable communication device (1), and wherein the grounding/short-circuiting confirmation device (400) comprises at least one of an imaging device, a clamp detection device for detecting a clamp function of a clamping device (EK) which is employed for grounding and short-circuiting and a device for detecting fixed ball points on a ball-head cap of the clamping device (EK).

14. The method as claimed in claim 12 wherein, further to confirmation (S11) of the grounding and short-circuiting of the electronic component (K1), output (S12) of a fourth work step instruction of the plurality of work step instructions (A) for a safeguarding and barrier protection of adjoining energized electronic components (K2, K3) is generated by the work step sequence program, followed by an automatic or manual confirmation (S13; S13') of the safeguarding and barrier protection of the adjoining energized electronic components (K2, K3) on the portable communication device (1).

15. The method as claimed in claim 14, wherein confirmation (S13') of the safeguarding and barrier protection of the adjoining energized electronic components (K2, K3) is executed automatically by a safeguarding/barrier protection confirmation device (500) which is communicatively connected to the portable communication device (1) and, in the event of a failed confirmation (S13'), output (S9e) of a second alarm signal is generated by the portable communication device (1), and wherein the safeguarding/barrier protection confirmation device (500) comprises at least one of an imaging device and a position detection device (LE) of a position of a barrier device (AS) which is employed for the safeguarding and barrier protection.

16. The method as claimed in claim 1, wherein an item of protective equipment (SA) is provided for a user, wherein a second bidirectional communication link (F3) is set up between the portable communication device (1) and the item of protective equipment (SA), and wherein the portable communication device (1) transmits the first alarm signal via the second bidirectional communication link (F3) to the item of protective equipment (SA) for the triggering of at least one of an optical warning device, an acoustic warning device (AE) and a vibration alarm device which is fitted to the item of protective equipment (SA).

17. The method as claimed in claim 16, wherein the item of protective equipment (SA) comprises at least one of a safety jacket, a safety helmet, safety goggles, a safety coat, protective overalls and a protective coat.

18. The method as claimed in claim 16, wherein the item of protective equipment (SA) comprises a vital signs sensor (VS), and vital signs data of the user are transmitted via the second bidirectional communication link (F3) to the portable communication device (1).

19. The method as claimed in claim 1, wherein at least one of 1) at least one of the first work step instruction and the second work step instruction of the plurality of work step instructions (A), the confirmation signal and 2) the first alarm signal is logged and saved in the portable communication device (1).

20. The method as claimed in claim 1, wherein the portable communication device (1) comprises a smartphone, a laptop or a tablet, smart glasses or a smartwatch.

21. The method as claimed in claim 1, wherein a voltage test point confirmation device (10e) is provided for confirming a voltage on a voltage test point, the voltage test point confirmation device (10e) being communicatively connected to the portable communication device (1), wherein, prior to the communication (S6) of the test result, a check (S5a) of the voltage on the voltage test point is executed by the voltage test point confirmation device (10e), and wherein communication (S6) of the test result from the portable voltage testing device (10; 10') to the portable communication device (1) is only executed in response to a successful check of the voltage on the voltage test point.

22. The method as claimed in claim 21, wherein the voltage test point confirmation device (10e) comprises at least one of an imaging device and a sensor device which is integrated in the portable voltage testing device (10; 10').

23. A device for the automatic monitoring of an electrotechnical workflow, particularly for the execution of the method as claimed in claim 1, comprising:

the portable communication device (1), comprising a first input apparatus (1b), a first output apparatus (1a), a first storage apparatus (1c) and a first bidirectional communication interface (1d);

the work step sequence program which is saved in the portable communication device (1);

the portable voltage testing device (10; 10'), comprising a second input apparatus (10c), a second output apparatus (10a), a second storage apparatus (10d) and a second bidirectional communication interface (10b);

wherein the first bidirectional communication link (F1) between the portable communication device (1) and the portable voltage testing device (10; 10') is establishable via the first and second bidirectional communication interfaces (1d, 10b).

24. The device as claimed in claim 23, further comprising an isolation confirmation device (200) which is connectable to the portable communication device (1) and which comprises at least one of an imaging device, a circuit state indicator device of a voltage switch(S) which is to be actuated for isolation and an electroluminescence measurement device for measuring an electric field on the electronic component (K1).

25. The device as claimed in claim 23, further comprising a reclosing protection confirmation device (300) which is connectable to the portable communication device (1) and which comprises at least one of an imaging device and a lock-out status notification device of a lock (D) which is to be actuated for protection against reclosing.

26. The device as claimed in claim 23, further comprising a grounding/short-circuiting confirmation device (400) which is connectable to the portable communication device (1), and which comprises at least one of an imaging device, a clamp detection device for detecting the clamp function of a clamping device (EK) which is employed for grounding and short-circuiting and a device for detecting fixed ball points on a ball-head cap of the clamping device (EK).

27. The device as claimed in claim 23, further comprising a safeguarding/barrier protection confirmation device (500) which is communicatively connectable to the portable communication device (1), and which comprises at least one of an imaging device and a position detection device (LE) of the position of a barrier device (AS) which is employed for safeguarding and barrier protection.

28. The device as claimed in claim 23, further comprising an item of protective equipment (SA) for a user, having a third bidirectional communication interface (SK) and at least one of an optical warning device, an acoustic warning device (AE) and a vibration alarm device which is fitted to the item of protective equipment (SA), wherein a second bidirectional communication link (F3) is establishable between the portable communication device (1) and the item of protective equipment (SA) via the first and third bidirectional communication interfaces (1*d*, SK).

29. The device as claimed in claim 28, wherein the item of protective equipment (SA) comprises at least one of a safety jacket, a safety helmet, safety goggles, a safety coat, protective overalls and a protective coat.

30. The device as claimed in claim 28, wherein the item of protective equipment (SA) comprises a vital signs sensor (VS).

31. The device as claimed in claim 23, wherein the portable communication device (1) comprises a smartphone, a laptop or a tablet, smart glasses or a smartwatch.

32. The device as claimed in claim 23, further comprising a voltage test point confirmation device (10*e*) which is connectable to the portable communication device (1) for confirming a voltage on a voltage test point of the portable voltage testing device (10; 10'), and which comprises at least one of an imaging device and a sensor device which is integrated in the portable voltage testing device (10; 10').

33. The device as claimed in claim 28, wherein the item of protective equipment (SA) comprises a sensor device which is configured to monitor the condition, use or servicing of the item of protective equipment (SA), and to execute the communication thereof via the third bidirectional communication interface (SK) to the stationary central communication device (100).

\* \* \* \* \*